United States Patent
Lee et al.

(10) Patent No.: US 10,014,181 B2
(45) Date of Patent: Jul. 3, 2018

(54) METHODS OF FORMING PATTERNS WITH MULTIPLE LAYERS FOR SEMICONDUCTOR DEVICES

(71) Applicant: Samsung Electronics Co., Ltd., Suwon-si, Gyeonggi-do (KR)

(72) Inventors: Jun-soo Lee, Seoul (KR); Hong-rae Kim, Seoul (KR); Jeon-il Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 6 days.

(21) Appl. No.: 15/215,152

(22) Filed: Jul. 20, 2016

(65) Prior Publication Data
US 2017/0125256 A1 May 4, 2017

(30) Foreign Application Priority Data
Oct. 29, 2015 (KR) .................. 10-2015-0151100

(51) Int. Cl.
*H01L 21/308* (2006.01)
*H01L 29/66* (2006.01)
*H01L 21/02* (2006.01)

(52) U.S. Cl.
CPC ...... *H01L 21/3081* (2013.01); *H01L 21/0217* (2013.01); *H01L 21/0228* (2013.01); *H01L 21/02115* (2013.01); *H01L 21/02164* (2013.01); *H01L 21/02271* (2013.01); *H01L 21/3086* (2013.01); *H01L 29/6656* (2013.01); *H01L 29/66795* (2013.01)

(58) Field of Classification Search
CPC ............ H01L 21/3086; H01L 21/3065; H01L 21/3081; H01L 21/32136; H01L 21/32139; H01L 21/32115; H01L 21/0273; H01L 21/31051
See application file for complete search history.

(56) References Cited

U.S. PATENT DOCUMENTS

| | | | |
|---|---|---|---|
| 9,343,370 B1* | 5/2016 | Lee | H01L 21/3083 |
| 2009/0117739 A1* | 5/2009 | Shin | H01L 21/0334 438/690 |
| 2009/0242945 A1 | 10/2009 | Cho et al. | |
| 2010/0323520 A1 | 12/2010 | Kim | |
| 2012/0009793 A1 | 1/2012 | Zhu | |
| 2012/0037592 A1 | 2/2012 | Metz | |
| 2012/0139086 A1 | 6/2012 | Kim et al. | |
| 2012/0142194 A1* | 6/2012 | Hwang | H01L 21/0337 438/703 |

(Continued)

FOREIGN PATENT DOCUMENTS

| JP | 2010-272731 A | 12/2010 |
|---|---|---|
| KR | 10-2014-0029501 A | 3/2014 |

*Primary Examiner* — Thanh T Nguyen
(74) *Attorney, Agent, or Firm* — Myers Bigel, P.A.

(57) ABSTRACT

Methods of forming patterns for semiconductor devices are provided. A method may include preparing a substrate including an etch target layer on a surface of the substrate; forming a mask pattern that includes a lower masking layer having a first density and an upper masking layer having a second density that is less than the first density, on the etch target layer; forming spacers that cover sidewalls of the lower masking layer and the upper masking layer; removing the mask pattern; and etching the etch target layer by using the spacers as an etching mask.

19 Claims, 7 Drawing Sheets

(56) References Cited

U.S. PATENT DOCUMENTS

| | | |
|---|---|---|
| 2012/0270395 A1 | 10/2012 | Ku |
| 2013/0244392 A1* | 9/2013 | Oh .................... H01L 29/66477 |
| | | 438/299 |
| 2014/0087554 A1 | 3/2014 | Wells |
| 2015/0031198 A1 | 1/2015 | Miyoshi et al. |
| 2015/0155171 A1* | 6/2015 | Chang ................ H01L 21/0338 |
| | | 438/703 |
| 2015/0255304 A1* | 9/2015 | Kang ................ H01L 21/31144 |
| | | 438/696 |

* cited by examiner

METHODS OF FORMING PATTERNS WITH MULTIPLE LAYERS FOR SEMICONDUCTOR DEVICES

CROSS-REFERENCE TO RELATED APPLICATION

The present application claims the benefit of Korean Patent Application No. 10-2015-0151100, filed on Oct. 29, 2015, in the Korean Intellectual Property Office, the disclosure of which is hereby incorporated herein in its entirety by reference.

FIELD

Example embodiments of the inventive concepts relate to methods of forming patterns for semiconductor devices, and more particularly, to methods of forming high-density patterns having ultra-fine widths and intervals at high-density areas of the semiconductor devices.

BACKGROUND

In order to fabricate a highly scaled semiconductor device having large-scale integration, as pattern widths decrease, it may be necessary to embody fine patterns having widths and intervals finer than the resolution limit of a photolithography operation. Therefore, there is a demand for a process for forming such fine patterns within the resolution limit of a general photolithography operation. Furthermore, there is a demand for semiconductor devices having new fine patterns to which such processes may be applied.

SUMMARY

The inventive concepts provide methods of forming patterns for semiconductor devices having formed therein a high-density pattern with ultra-fine widths and intervals by using patterns having sizes that may be embodied within the resolution limit of a photolithography operation.

According to some embodiments of the inventive concepts, methods of forming patterns for semiconductor devices are provided. A method may include including preparing a substrate including an etch target layer on a surface of the substrate; forming a mask pattern that includes a lower masking layer having a first density and an upper masking layer having a second density that is less than the first density, on the etch target layer; forming spacers that cover sidewalls of the lower masking layer and the upper masking layer; removing the mask pattern; and etching the etch target layer by using the spacers as an etching mask.

In some embodiments, the first density of the lower masking layer may be equal to or greater than about 2 g/cm$^3$ and may be smaller than or equal to about 3.9 g/cm$^3$. The second density of the upper masking layer may be equal to or greater than about 1 g/cm$^3$ and may be smaller than or equal to about 2 g/cm$^3$.

In some embodiments, the lower masking layer may include a silicon nitride film or a silicon oxide film; and the upper masking layer may include a carbon-containing film.

In some embodiments, the forming of the mask pattern may include forming the lower masking layer at a process temperature equal to or higher than room temperature and smaller than or equal to about 400° C. using an atomic layer deposition (ALD) process.

In some embodiments, the forming of the mask pattern may include forming the upper masking layer using a chemical vapour deposition (CVD) process.

In some embodiments, the forming of the mask pattern may include forming the lower masking layer, wherein a thickness of the lower masking layer in a direction that is perpendicular to the surface of the substrate is from about ⅓ to about ½ of a total thickness of the mask pattern in the direction that is perpendicular to the surface of the substrate.

In some embodiments, the removing of the mask pattern may include a first etching operation including etching the upper masking layer; and a second etching operation including etching the lower masking layer.

In some embodiments, the lower masking layer and the spacers may have different etching selectivities.

In some embodiments, the lower masking layer and the etch target layer may have different etching selectivities.

In some embodiments, the first etching operation may include dry etching the upper masking layer.

In some embodiments, the second etching operation may include wet etching the lower masking layer.

In some embodiments, the forming of the spacers may include forming metal oxide films.

In some embodiments, the forming of the spacers may include forming the spacers at a process temperature equal to or higher than room temperature and smaller than or equal to about 400° C., by using an atomic layer deposition (ALD) process.

In some embodiments, in the preparing of the substrate, the etch target layer may include a plurality of layers. At least one of the plurality of layers may be a carbon-containing layer.

According to some embodiments of the inventive concepts, methods of forming patterns for semiconductor devices are provided. A method may include preparing a substrate including an etch target layer on a surface of the substrate; and forming a mask pattern including a plurality of layers that are sequentially formed on the etch target layer. Ones of the plurality of layers may include different densities as compared to each other. The method may include forming spacers that cover sidewalls of the plurality of layers of the mask pattern; sequentially removing the plurality of layers of the mask pattern; anisotropically etching the etch target layer using the spacers as an etching mask; and removing a residue of the spacers remaining after the anisotropically etching.

In some embodiments, the forming of the mask pattern may include forming a lower first masking layer having a first density; forming a second masking layer on the lower first masking layer having a second density that is lower than the first density; and forming a third masking layer on the second masking layer having a third density that is lower than the second density.

In some embodiments, the forming of the lower first masking layer may include forming a silicon nitride film. The forming the second masking layer may include forming a silicon oxide film. The forming the third masking layer may include forming a carbon-containing film.

According to some embodiments of the inventive concepts methods of forming etched patterns on a surface of a substrate are provided. A method may include forming an etch target layer on the surface of the substrate. The method may include forming a plurality of masking layers on the etch target layer. The plurality of masking layers may include a first masking layer adjacent the etch target layer including a first density. The plurality of masking layers may include a second masking layer on the first masking layer including a second density that is less than the first density. The method may include etching the plurality of masking layers to form a plurality of mask patterns. The method may include forming spacers that cover sidewalls of the mask patterns. The method may include removing the mask patterns. The method may include etching the etch target layer using the spacers as an etching mask. The method may include removing portions of the spacers remaining after etching the etch target layer.

In some embodiments, the first masking layer may include a thickness in a first direction that is perpendicular to the surface of the substrate that is about ½ of a total thickness of the plurality of masking layers in the first direction. The second masking layer may include a thickness in the first direction that is about ½ of the total thickness of the plurality of masking layers in the first direction.

In some embodiments, the first masking layer may include a thickness in a first direction that is perpendicular to the surface of the substrate that is about ⅓ of a total thickness of the plurality of masking layers in the first direction. The second masking layer may include a thickness in the first direction that is about ⅔ of the total thickness of the plurality of masking layers in the first direction.

In some embodiments, the plurality of masking layers may include at least three masking layers sequentially stacked in order of decreasing density with the first masking layer adjacent the etch target layer including the highest density and an upper masking layer furthest from the etch target layer including the lowest density.

In some embodiments, the forming the spacers may include conformally forming a spacer layer on the mask patterns and anisotropically etching the spacer layer. The anisotropically etching the spacer layer may remove at least a portion of an uppermost one of the plurality of masking layers that is furthest from the etch target layer. The removing the mask patterns may include sequentially removing remaining ones of the plurality of mask layers.

It is noted that aspects of the inventive concepts described with respect to one embodiment may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

BRIEF DESCRIPTION OF THE DRAWINGS

The above and other objects, features, and advantages of the present disclosure will become more apparent to those of ordinary skill in the art by describing in detail embodiments of the inventive concepts thereof with reference to the accompanying drawings, in which.

DETAILED DESCRIPTION OF THE EMBODIMENTS

The inventive concepts will now be described more fully with reference to the accompanying drawings, in which exemplary embodiments of the inventive concepts are shown. The inventive concepts may, however, be embodied in many different forms and should not be construed as being limited to the embodiments set forth herein. Like reference numerals refer to like elements throughout this application.

It will be understood that, although the terms first, second, third, etc., may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the inventive concepts.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some embodiments, a specific process order may be performed differently from the described order. For example, in some embodiments, two consecutively described processes may be performed substantially at the same time or performed in an order opposite to the described order.

Embodiments of the inventive concepts are described herein with reference to cross-section illustrations that are schematic illustrations of idealized embodiments (and intermediate structures) of the inventive concepts. As such, variations from the shapes of the illustrations as a result, for example, of manufacturing processes and/or tolerances, are to be expected. Thus, embodiments of the inventive concepts should not be construed as limited to the particular shapes of regions illustrated herein but are to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

Figure 1:
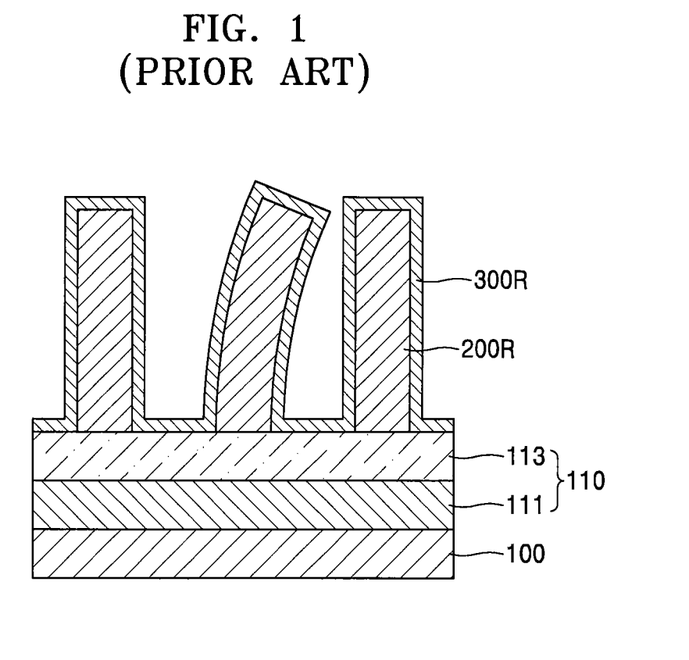
FIG. 1 is a cross sectional view schematically illustrating an intermediate process operation of some conventional methods of forming patterns for semiconductor devices.

FIG. 1 is a cross sectional view schematically illustrating an intermediate process operation of some conventional methods of forming patterns for semiconductor devices. The embodiments illustrated in FIG. 1 may be used for the purposes of comparing to various embodiments of the inventive concepts.

A semiconductor memory device may have a relatively large-scale integration due to the structure in which a plurality of memory cells are connected to one another. However, in order to shrink a semiconductor chip size, there may be a demand for further reducing a design rule for fabricating semiconductor memory devices. Furthermore, as a design rule is reduced, the minimum pitches of patterns used to produce the semiconductor memory devices may be significantly reduced.

Therefore, in order to embody fine patterns according to the reduced design rule, it may be important to develop and apply methods of forming separated fine patterns with sufficient process margins by using patterns that may be embodied within a possible resolution limit based on exposing equipments and exposing processes provided by existing photolithography processes, in terms of fabrication of semiconductor devices.

To this end, methods of embodying semiconductor devices having ultra-fine patterns by applying a double patterning technology (DPT) to a mask pattern having a certain shape that may be embodied in current photolithography processes have been suggested.

However, as patterns of a semiconductor memory device become finer, although the width of a mask pattern is significantly reduced to a critical dimension (CD) due to a design rule, the mask pattern may have a minimum height in order to function as an etching mask for etching etch target layers. Therefore, as the width decreases while the height remains the same, the aspect ratio of the mask pattern increases, which may result in a mask pattern that is curved or leaned.

Referring to FIG. 1, a mask pattern 200R, which includes a single low-density material (e.g., a carbon-containing layer), may be arranged on an etch target layer 110. A portion of the mask pattern 200R may be curved.

In order to form fine patterns by applying the DPT, the etch target layer 110 to be etched may be formed on a substrate 100. In some embodiments, the etch target layer 110 may include a lower etch target layer 111 and an upper etch target layer 113. After the mask pattern 200R is patterned onto the etch target layer 110, a spacer layer 300R that conformally covers the mask pattern 200R may be formed.

If the mask pattern 200R includes a single low density material, for ease of patterning the mask pattern 200R to a desired shape and ease of removal thereof after later operations, the mask pattern 200R may include a carbon-containing layer. Although it may be easy to remove the mask pattern 200R including a single material layer (that is, a carbon-containing layer) after later operations are performed, due to the low density of the material constituting the mask pattern 200R, a leaning defect may occur at a portion of the mask pattern 200R if the mask pattern 200R is fabricated as a fine pattern with a high aspect ratio. Due to the leaning defect, an interval of the mask pattern 200R is reduced and a space needed for etching is narrowed, and thus a not open defect may occur at a final pattern formed on the etch target layer 110.

If an aspect ratio is reduced to prevent leaning defects of the mask pattern 200R by reducing the thickness (i.e., the height) of the mask pattern 200R, leaning defects of the mask pattern 200R may be reduced. However, the reduction of the thickness of the mask pattern 200R may cause insufficiency of spacers that are used as an etching mask for etching the etch target layer 110 in the DPT. Therefore, the spacers may not survive until the etch target layer 110 is etched, and thus an etching defect of the etch target layer 110 may occur.

Methods of forming patterns for semiconductor device according to some embodiments of the inventive concepts may include reducing leaning defects of a mask pattern and etching defects of an etch target layer by forming a mask pattern including a plurality of layers.

FIGS. 2 through 9 are cross sectional views schematically illustrating intermediate process operations of methods of forming patterns for semiconductor devices according to some embodiments of the inventive concepts. Some of the elements illustrated in FIGS. 2 through 9 may be the same as elements illustrated in FIG. 1 except as described herein. Duplicated description of like elements may be omitted herein for brevity.

Figure 2:
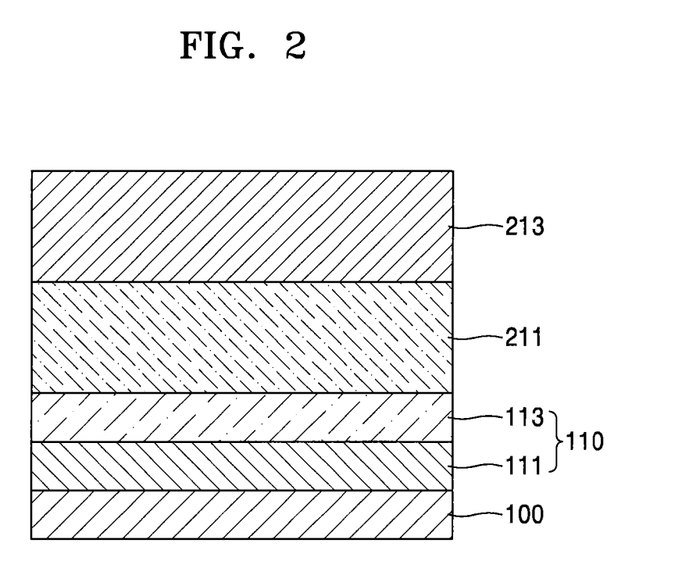
FIGS. 2 through 9 are cross sectional views schematically illustrating intermediate process operations of methods of forming patterns for semiconductor devices according to some embodiments of the inventive concepts.

Referring to FIG. 2, the etch target layer 110 to be etched may be formed on the substrate 100. A lower masking layer 211 and an upper masking layer 213 may be formed on the etch target layer 110.

The substrate 100 may contain a semiconductor material, e.g., a group IV semiconductor, a group III-V compound semiconductor, or a group II-VI oxide semiconductor. For example, the group IV semiconductor may include silicon, germanium, or silicon-germanium. The substrate 100 may be a bulk wafer or an epitaxial layer. Alternatively, the substrate 100 may be a semiconductor substrate, such as a silicon-on-insulator (SOI) substrate or a gallium-arsenic substrate. Although not shown, various types of unit devices needed for forming semiconductor devices, such as active devices or passive devices, may be formed on the substrate 100.

The etch target layer 110 may be a conductive layer and/or an insulation layer and may include a metal, a semiconductor, or an insulation material, for example. The etch target layer 110 may include a single layer or a plurality of layers. The etch target layer 110 may be a double layer including a lower etch target layer 111 and an upper etch target layer 113. In this case, the lower etch target layer 111 and/or the upper etch target layer 113 may be a carbon-containing layer. Alternatively, the etch target layer 110 may include a single layer or a plurality of layers (3 or more layers). The layer structure of the etch target layer 110 may vary according to types of final fine patterns to be formed for a semiconductor device.

Figure 3:
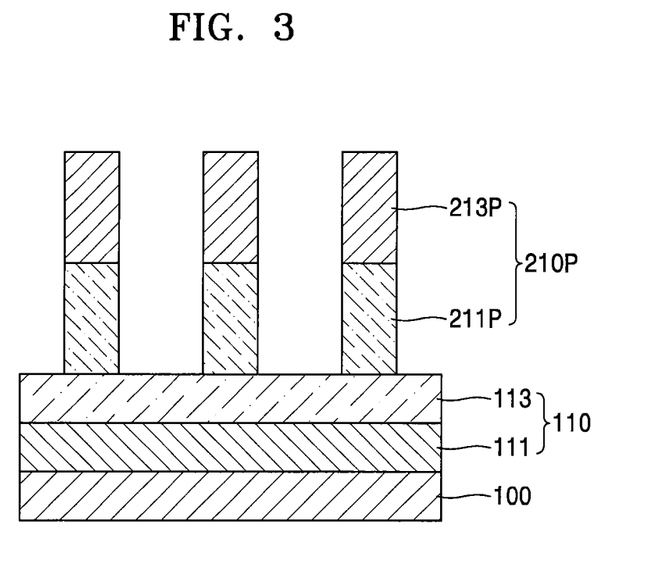

The lower masking layer 211 and the upper masking layer 213 may perform different functions at the mask pattern 210P (refer to FIG. 3). The lower masking layer 211 may function as a high-density thickness compensating film. The lower masking layer 211 may form a firm lower layer at the mask pattern 210P (refer to FIG. 3) and reduce leaning defects. Although the density of the upper masking layer 213 may be low, the upper masking layer 213 may be easily formed and easily removed after later operations are performed, and thus the upper masking layer 213 may lower process difficulty.

The lower masking layer 211 and the upper masking layer 213 may include different materials according to patterning processes, formed films, and methods of forming the films in later operations.

A first density of a material constituting the lower masking layer 211 may be higher than a second density of a material constituting the upper masking layer 213. For example, in some embodiments, the first density of a material constituting the lower masking layer 211 may be equal to or higher than about 2 g/cm$^3$ and may be smaller than or equal to about 3.9 g/cm$^3$. In detail, in some embodiments, the lower masking layer 211 may include a silicon oxide (SiO$_2$) film having a density of about 2.2 g/cm$^3$ or a silicon nitride (Si$_3$N$_4$) film having a density of about 3.1 g/cm$^3$, although embodiments of the inventive concepts are not limited thereto. The above-stated silicon-based materials may be formed at a process temperature equal to or higher than room temperature and smaller than or equal to about 400° C., by using an atomic layer deposition (ALD) process. Room temperature may be about 23° C.

The ALD process may be a nano thin-film deposition process using the phenomenon that single atomic layers are chemically combined with one another during a semiconductor fabrication process, where ultra-fine films having an atomic layer thickness may be formed layer-by-layer by repeatedly absorbing and substituting molecules. Furthermore, films may be formed at a lower temperature (generally, below or equal to about 400° C.) compared to a chemical vapor deposition (CVD) process. Therefore, thin-films may be formed without inflicting thermal damages to films formed therebelow. Therefore, even if the etch target layer 110 consists of a carbon-containing layer, the lower masking layer 211 may be formed without inflicting thermal damages to the etch target layer 110.

In some embodiments, the second density of a material constituting the upper masking layer 213 may be may be equal to or higher than about 1 g/cm$^3$ and may be smaller than about 2 g/cm$^3$. In some embodiments, the upper masking layer 213 may include a carbon-containing layer having a density of about 1.31 g/cm$^3$ or about 1.76 g/cm$^3$, although embodiments of the inventive concepts are not limited thereto. The carbon-containing layer may be a spin-on-hardmask (SOH) or an amorphous carbon layer (ACL).

In order to form the upper masking layer 213, a spin coating operation or a CVD operation may be performed. An example of operations for forming the upper masking layer 213 using a carbon-containing layer is described below. An organic compound layer having a thickness from about 1000 Å to about 5000 Å may be formed on the lower masking layer 211. If necessary, a spin coating operation may be performed. The organic compound may contain a hydrocarbon compound including an aromatic ring, such as phenyl, benzene, or naphthalene, or a derivative thereof. The organic compound may have a relatively high carbon content from about 85 weight % to about 99 weight % with respect to the total weight of the organic compound. A carbon-containing layer may be formed by primarily baking the organic compound at a temperature from about 150° C. to about 350° C. The primary baking may be performed for about 60 seconds. Next, the carbon-containing layer may be cured by secondarily baking the carbon-containing layer at a temperature from about 350° C. to about 550° C. The secondary baking may be performed from about 30 seconds to about 300 seconds. As described above, by curing the carbon-containing layer by performing the secondary baking operation, when another film is formed on the carbon-containing layer, even if an operation for forming the film is performed at a relatively high temperature equal to or above 400° C., the carbon-containing layer may not be thermally damaged during the operation.

Referring to FIG. 3, the mask pattern 210P may be formed via a photolithography operation and an etching operation. The mask pattern 210P may be formed by forming a photoresist layer on the upper masking layer 213 (refer to FIG. 2) and performing a photolithography operation and an etching operation thereto. The upper mask layer 213 and the lower mask layer 211 may have an etch selectivity with the etch target layer 110. Since the formation of the mask pattern 210P may be a common semiconductor fabricating process known in the art, detailed descriptions thereof may be omitted.

The mask pattern 210P may include a lower mask pattern 211P and an upper mask pattern 213P. In some embodiments, the thickness (i.e., height) of the lower mask pattern 211P may be substantially identical to that of the upper mask pattern 213P. In other words, a portion of the thickness of the mask pattern 210P corresponding to the lower mask pattern 211P may be about ½ of the total thickness of the mask pattern 210P. In the mask pattern 210P having the thickness ratio as described above, because a portion of the thickness of the mask pattern 210P corresponding to the lower mask pattern 211P including a material with a relatively high density is relatively large, leaning defects may less likely occur.

Figure 4:
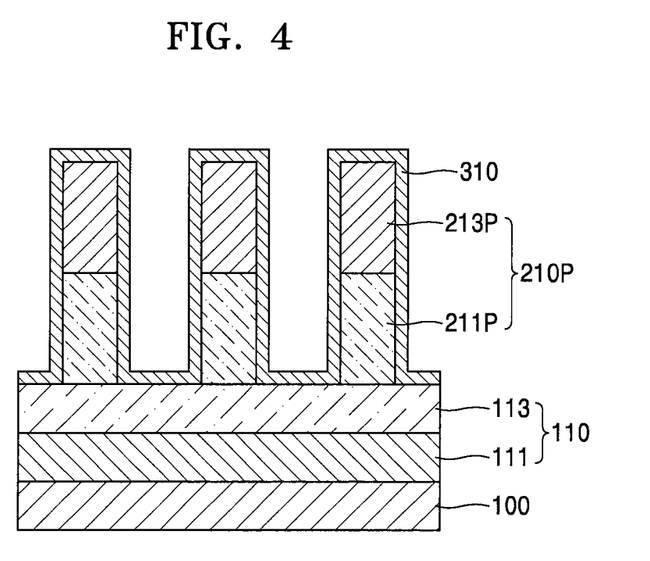

Referring to FIG. 4, a spacer layer 310 may be conformally formed on an exposed surface of the etch target layer 110 and on side surfaces and top surfaces of the mask pattern 210P.

The spacer layer 310 may be formed by using an ALD process. If the etch target layer 110 and the upper mask pattern 213P include carbon-containing layers before the spacer layer 310 is formed, the carbon-containing layers may be thermally damaged at a high temperature operation. Therefore, the spacer layer 310 may be formed at a process temperature equal to or higher than room temperature and smaller than or equal to about 400° C., by using an ALD process. However, it is merely example, and methods of forming the spacer layer 310 may vary according, for example, to materials constituting the etch target layer 110 and the upper mask pattern 213P.

A material for forming the spacer layer 310 may be any material having an etching selectivity with respect to the mask pattern 210P and the etch target layer 110 and is not limited. For example, the spacer layer 310 may include a metal oxide film or a silicon oxide film. An example of metal oxide film formed by using an ALD process may be a titanium oxide (TiO$_2$) layer.

The thickness of the spacer layer 310 is not limited and may be, for example, in some embodiments, ⅓ of the width of the mask pattern 210P. The spacer layer 310 may be formed, in some embodiments, to have a thickness identical to the width of a final pattern 110P (refer to FIG. 9) to be finally formed on the etch target layer 110.

Figure 5:
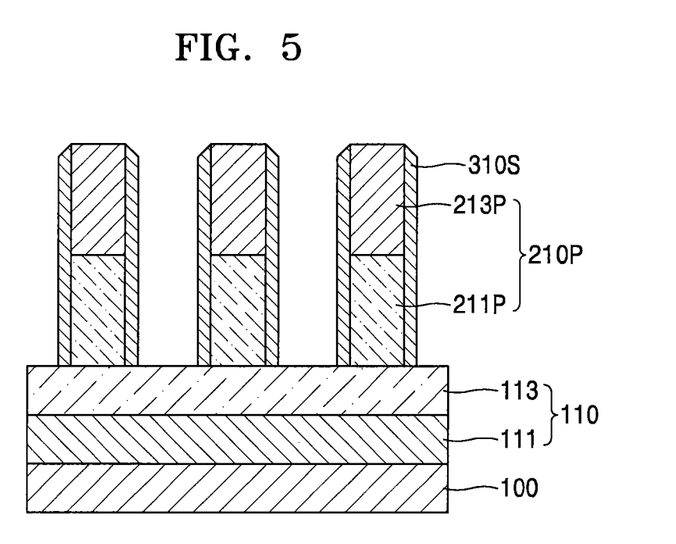

Referring to FIG. 5, spacers 310S may be formed by anisotropically etching the spacer layer 310 (refer to FIG. 4).

In order to form the spacers 310S, in some embodiments, C$_x$F$_y$ gas or CH$_x$F$_y$ gas may be used as a main etching gas. Alternatively, in some embodiments, the main etching gas may be mixed with at least one of O$_2$ gas or Ar gas.

When the spacer layer 310 (refer to FIG. 4) is etched, plasma of an etching gas selected, for example, from among the above-stated etching gases may be generated inside an etching chamber, and then the spacer layer 310 may be etched in the plasma atmosphere. Alternatively, plasma may not be generated inside the etching chamber, and thus the spacer layer 310 may be etched in the selected etching gas atmosphere without ion energy.

The width of the spacer 310S may be identical to the thickness of the spacer layer 310 (refer to FIG. 4). In other words, the width of the spacer 310S may be, in some embodiments, ⅓ of the width of the mask pattern 210P. The spacer 310S may be, in some embodiments, formed to have a width identical to the width of a final pattern 110P (refer to FIG. 9) to be finally formed on the etch target layer 110.

The spacers 310S may be formed on sidewalls of the mask pattern 210P. In detail, the spacers 310S may be formed to cover sidewalls of the lower mask pattern 211P and the upper mask pattern 213P.

Figure 6:
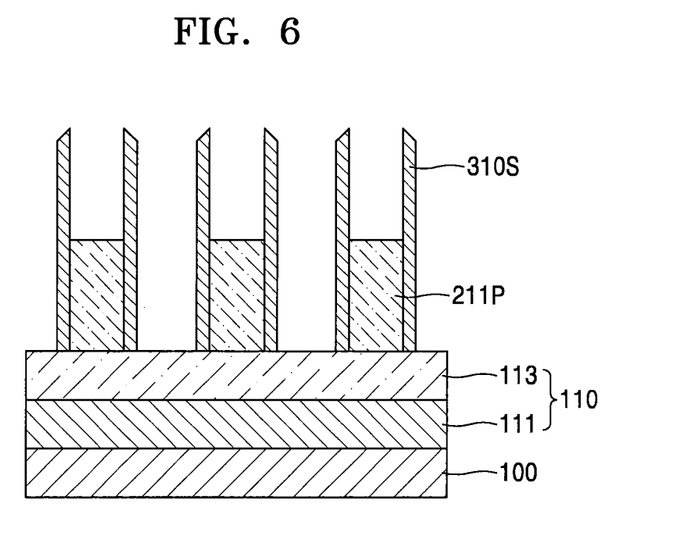

Referring to FIG. 6, after the spacers 310S are formed, the upper mask pattern 213P (refer to FIG. 5) may be removed.

According to a material constituting the upper mask pattern 213P (refer to FIG. 5), if the upper mask pattern 213P (refer to FIG. 5) is a carbon-containing layer, for example, the upper mask pattern 213P may be removed in a dry etching operation or an ashing operation. The removal of the upper mask pattern 213P (refer to FIG. 5) may be performed under conditions for suppressing consumption of the spacers 310S and the etch target layer 110. In some embodiments, the lower mask pattern 211P may also be partially etched.

Figure 7:
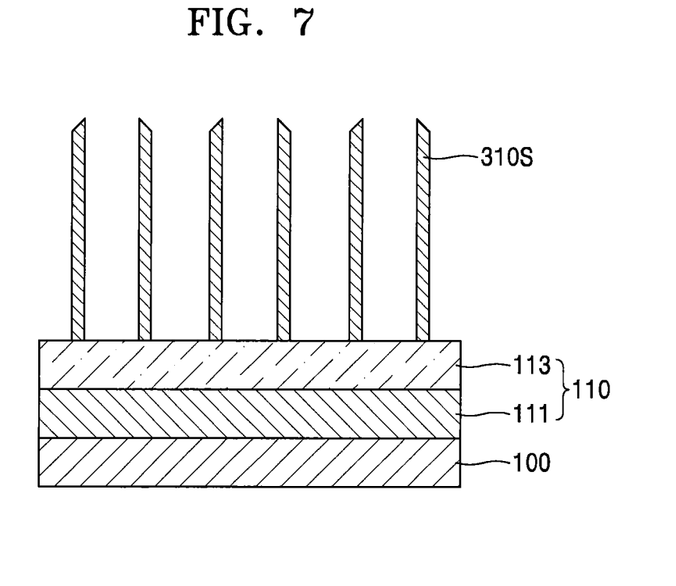

Referring to FIG. 7, after the upper mask pattern 213P (refer to FIG. 5) is removed, the lower mask pattern 211P (refer to FIG. 6) may be removed, thereby removing the entire mask pattern 210P (refer to FIG. 5).

After the upper mask pattern 213P (refer to FIG. 5) is removed, according to a material constituting the lower mask pattern 211P (refer to FIG. 6), if the lower mask pattern 211P is a silicon oxide film or a silicon nitride film, the lower mask pattern 211P may be removed in a wet etching operation or a dry etching operation. The removal of the lower mask pattern 211P (refer to FIG. 6) may be performed under conditions for suppressing consumption of the spacers 310S and the etch target layer 110.

When the lower mask pattern 211P (refer to FIG. 6) is removed, as the thickness of the portion of the mask pattern 210P (refer to FIG. 5) corresponding to the thickness of the lower mask pattern 211P (refer to FIG. 6) and the density of a material constituting the lower mask pattern 211P increase, the removal of the lower mask pattern 211P may affect other films more. Therefore, the lower mask pattern 211P (refer to FIG. 6) may be removed in a wet etching operation that does not significantly affect the spacer 310S and the etch target layer 110.

Figure 8:
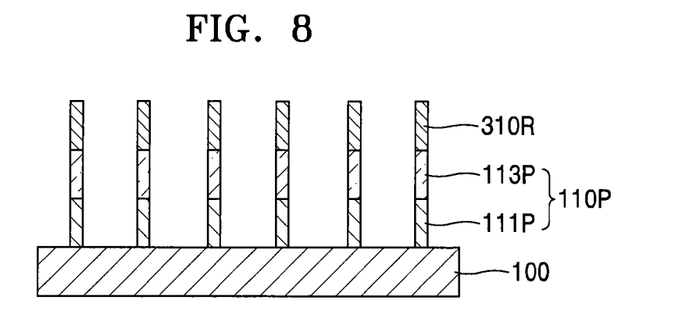
Figure 9:
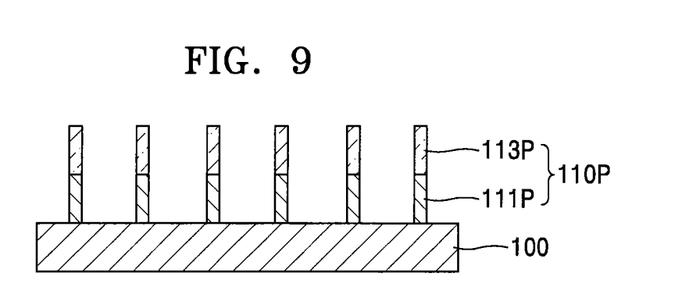

Referring to FIGS. 8 and 9, the desired final pattern 110P may be formed by anisotropically etching the etch target layer 110 (refer to FIG. 7) by using the spacer 310S (refer to FIG. 7) as an etching mask.

For example, as an anisotropic etching method for forming the final pattern 110P, a reactive ion etching (RIE) method or an inductively coupled plasma (ICP) etching method may be used. Here, a residue 310R of the spacer 310S (refer to FIG. 7) may remain on the top of the final pattern 110P. The remaining residue 310R may be further removed.

By performing operations as described above, not open defects and/or etching defects may not occur in the final pattern 110P having ultra-fine widths and intervals during a process for forming patterns for semiconductor devices using the DPT. Therefore, an efficiency of fabricating semiconductor devices may increase and costs for fabricating semiconductor devices may be reduced.

Figure 10:
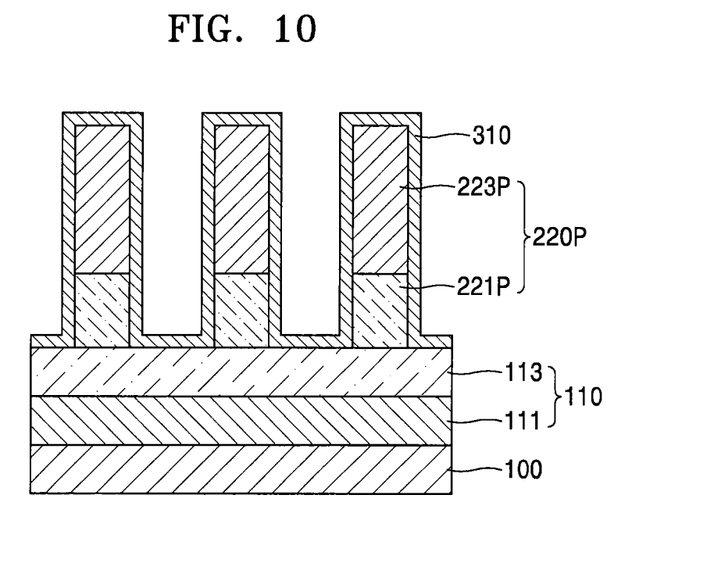
FIG. 10 is a cross sectional view schematically illustrating an intermediate process operation of methods of forming patterns for semiconductor devices, according to some embodiments of the inventive concepts.

FIG. 10 is a cross sectional view schematically illustrating an intermediate process operation of methods of forming patterns for semiconductor devices, according to some embodiments of the inventive concepts. Some of the elements illustrated in FIG. 10 may be the same as elements illustrated in FIG. 4 except as described herein. Duplicated description of like elements may be omitted herein for brevity.

Referring to FIG. 10, in order to form fine patterns by using the DPT, the etch target layer 110 to be etched may be formed on the substrate 100, a mask pattern 220P consisting of a lower mask pattern 221P and an upper mask pattern 223P may be patterned onto the etch target layer 110, and the spacer layer 310 that conformally covers the mask pattern 220P may be formed thereon.

According to the some embodiments of the inventive concepts, the thickness (i.e., height) of the lower mask pattern 221P may be about ⅓ of the total thickness of the mask pattern 220P. Since the thickness of a portion of the mask pattern 220P corresponding to the thickness of the lower mask pattern 221P is smaller than the thickness of a portion of the mask pattern 220P corresponding to the thickness of the upper mask pattern 223P, the lower mask pattern 221P may be easily removed after later operations are formed. In other words, in an operation for removing the lower mask pattern 221P, consumption of other films may be suppressed by reducing a time period elapsed for an etching operation.

Therefore, the mask pattern 220P may be formed by adjusting the thickness of the lower mask pattern 221P according to a size of and a material constituting a final pattern to be formed.

Figure 11:
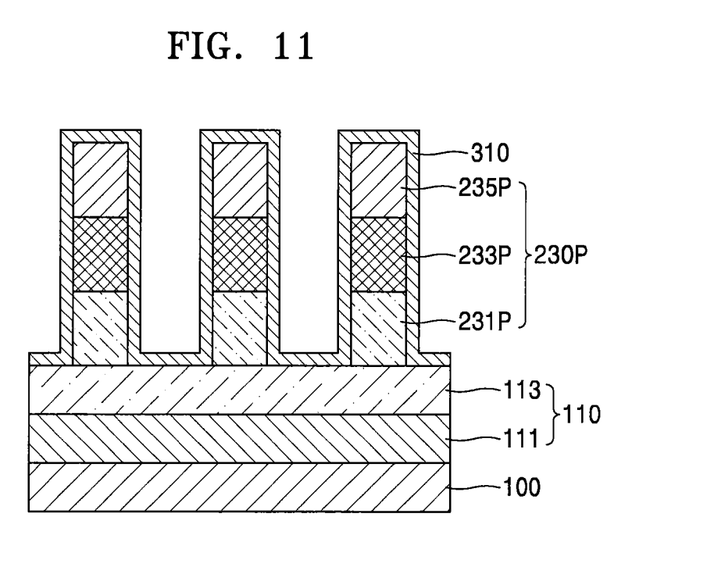
FIG. 11 is a cross sectional view schematically illustrating an intermediate process operation of methods of forming patterns for semiconductor devices, according to some embodiments of the inventive concepts.

FIG. 11 is a view schematically illustrating an intermediate process operation of methods of forming patterns for semiconductor devices, according to some embodiments of the inventive concepts. Some of the elements illustrated in FIG. 11 may be the same as elements illustrated in FIGS. 4 and/or 10 except as described herein. Duplicated description of like elements may be omitted herein for brevity.

Referring to FIG. 11, in order to form fine patterns by using the DPT, the etch target layer 110 to be etched may be formed on the substrate 100, a mask pattern 230P consisting of a first mask pattern 231P, a second mask pattern 233P, and a third mask pattern 235P may be patterned onto the etch target layer 110, and the spacer layer 310 that conformally covers the mask pattern 230P may be formed thereon.

Densities of materials constituting the first mask pattern 231P, the second mask pattern 233P, and the third mask pattern 235P may decrease as a distance from the substrate 100 increases. In detail, the material constituting the first mask pattern 231P may have the highest density, whereas the material constituting the third mask pattern 235P may have the lowest density. For example, the first mask pattern 231P may include a silicon nitride film, the second mask pattern 233P may include a silicon oxide film, and the third mask pattern 235P may include a carbon-containing film.

In this case, an operation for etching the mask pattern 230P may vary according to materials constituting the mask pattern 230P. Although descriptions are given above in relation to the mask pattern 230P including 3 layers, in some embodiments, a mask pattern may be formed to include four or more layers.

Figure 12:
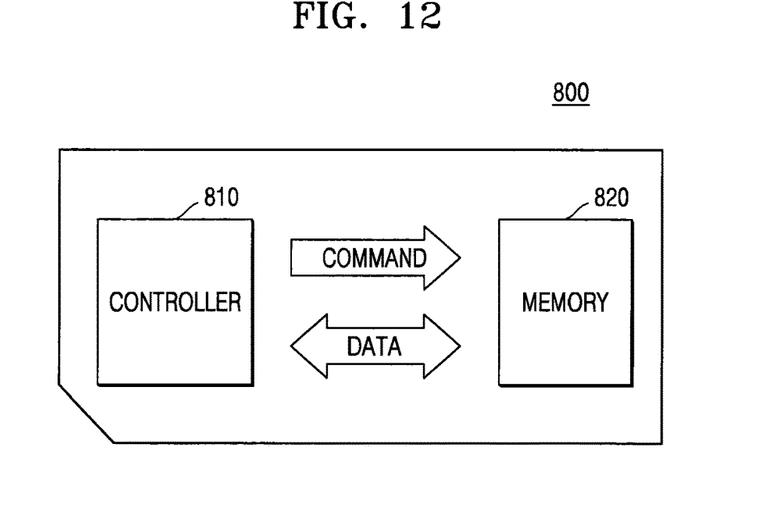
FIG. 12 is a block diagram schematically illustrating a card including a semiconductor device fabricated by using a method of forming patterns for semiconductor devices according to some embodiments of the inventive concepts.

FIG. 12 is a block diagram schematically illustrating a card 800 including a semiconductor device fabricated by using a method of forming patterns for semiconductor devices according to some embodiments of the inventive concepts.

In detail, the card 800 may include a controller 810 and a memory 820, where the controller 810 and the memory 820 may be arranged to exchange electric signals. For example, if the controller 810 issues a command, the memory 820 may transmit data. The memory 820 and/or the controller 810 may include one or more semiconductor devices fabricated by using a method of forming patterns for semiconductor devices according to some embodiments of the inventive concepts. The card 800 may be one of various types of cards, e.g., a memory stick card, a smart media (SM) card, a secure digital (SD) card, a mini SD card, or a multimedia card (MMC).

Figure 13:
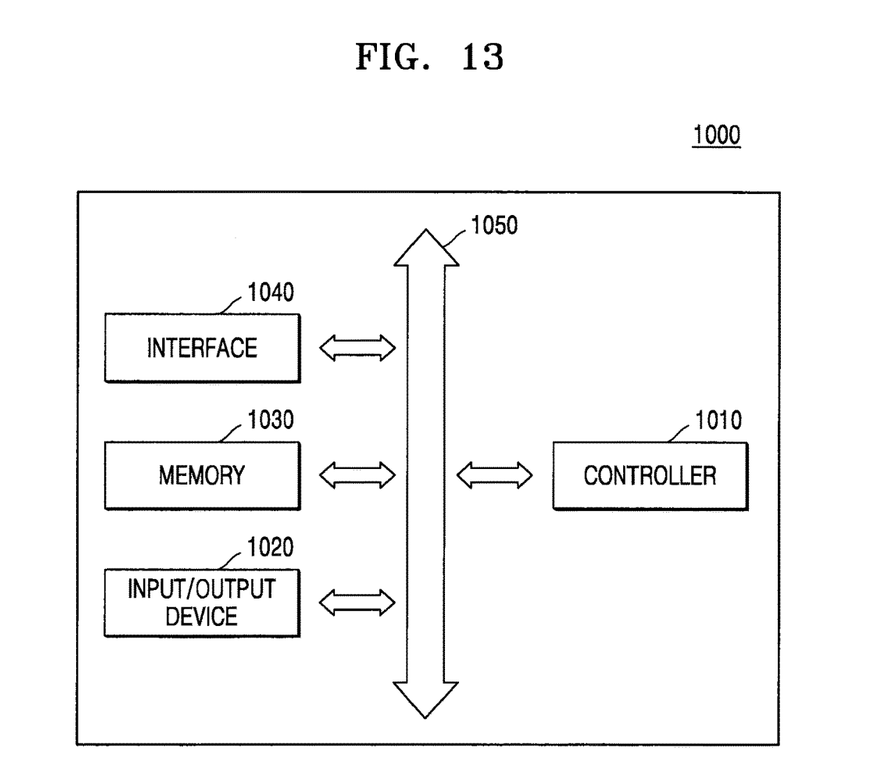
FIG. 13 is a block diagram schematically illustrating an electronic system including a semiconductor device fabricated by using a method of forming patterns for semiconductor devices according to some embodiments of the inventive concepts.

FIG. 13 is a block diagram schematically illustrating an electronic system 1000 including a semiconductor device fabricated by using a method of forming patterns for semiconductor devices according to some embodiments of the inventive concepts.

In detail, the electronic system 1000 may include a controller 1010, an input/output (I/O) device 1020, a memory 1030, and an interface 1040. The electronic system 1000 may be a mobile system or a system for transmitting/receiving data. The mobile system may be, for example, a personal digital assistant (PDA), a portable computer, a web tablet, a wireless phone, a mobile phone, a digital music player, or a memory card.

The controller 1010 may execute a program and control the electronic system 1000. The controller 1010 may include a semiconductor device fabricated by using a method of forming patterns for semiconductor devices according to some embodiments of the inventive concepts. For example, the controller 1010 may be a microprocessor, a digital signal processor, a microcontroller, or the like.

The I/O device 1020 may be used to input or output data to/from the electronic system 1000. The electronic system 1000 may be connected to an external device (not shown), e.g., a personal computer or a network, via the I/O device 1020 and may exchange data with the external device. The I/O device 1020 may be a keypad, a keyboard, or a display device, for example.

The memory 1030 may store codes and/or data for operating the controller 1010 and/or may store data processed by the controller 1010. The memory 1030 may include a semiconductor device fabricated by using a method of forming patterns for semiconductor devices according to some embodiments of the inventive concepts. The interface 1040 may be a data transmission path between the electronic system 1000 and the external device. The controller 1010, the I/O device 1020, the memory 1030, and the interface 1040 may communicate with each other via a bus 1050.

For example, the electronic system 1000 may be used in a mobile phone, a MP3 player, a navigation device, a portable multimedia player (PMP), a solid state disk (SSD), or a household appliance.

Figure 14:
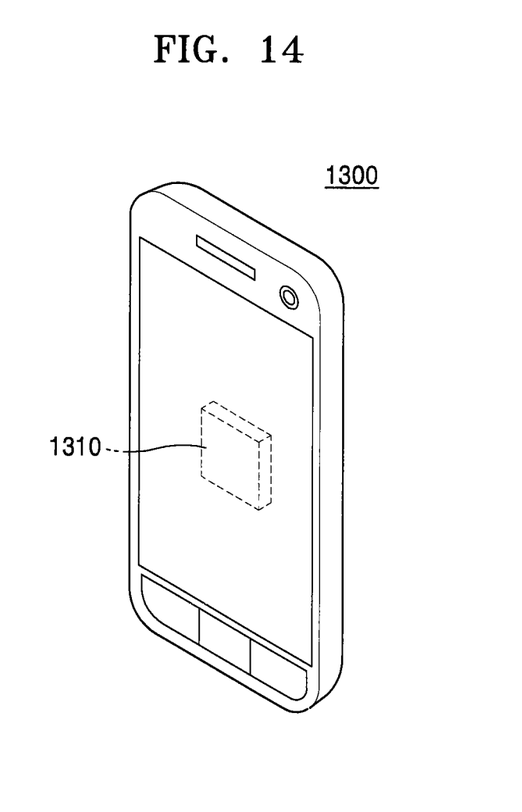
FIG. 14 is a perspective view schematically illustrating an electronic device including a semiconductor device fabricated by using a method of forming patterns for semiconductor devices according to some embodiments of the inventive concepts.

FIG. 14 is a perspective view schematically illustrating an electronic device including a semiconductor device fabricated by using a method of forming patterns for semiconductor devices according to some embodiments of the inventive concepts.

In detail, FIG. 14 shows that the electronic system 1000 (refer to FIG. 7) applied to a mobile phone 1300. The mobile phone 1300 may include a system-on-chip 1310. The system-on-chip 1310 may include a semiconductor device fabricated by using a method of forming patterns for semiconductor devices according to some embodiments of the inventive concepts. Since the mobile phone 1300 may include the system-on-chip 1310 in which a relatively high performance main function block may be arranged, the mobile phone 1300 may exhibit relatively high performance.

Furthermore, since the system-on-chip 1310 may have a relatively high performance for a same size, the mobile phone 1300 may exhibit relatively high performance and have the smallest possible size.

While the inventive concepts have been particularly shown and described with reference to some embodiments of the inventive concepts thereof, it will be understood that various changes in form and details may be made therein without departing from the spirit and scope of the following claims.

What is claimed is:

1. A method of forming patterns for a semiconductor device, the method comprising:
   preparing a substrate comprising an etch target layer on a surface of the substrate;
   forming a mask pattern that comprises a lower masking layer having a first density and an upper masking layer having a second density that is less than the first density, on the etch target layer;
   forming spacers that cover sidewalls of the lower masking layer and the upper masking layer;
   removing the mask pattern; and
   etching the etch target layer by using the spacers as an etching mask,
   wherein the forming of the mask pattern comprises forming the lower masking layer, wherein a thickness of the lower masking layer in a direction that is perpendicular to the surface of the substrate is from about ⅓ to about ½ of a total thickness of the mask pattern in the direction that is perpendicular to the surface of the substrate.

2. The method of claim 1,
   wherein the first density of the lower masking layer is equal to or greater than about 2 g/cm$^3$ and is smaller than or equal to about 3.9 g/cm$^3$, and
   wherein the second density of the upper masking layer is equal to or greater than about 1 g/cm$^3$ and is smaller than or equal to about 2 g/cm$^3$.

3. The method of claim 1,
   wherein the lower masking layer comprises a silicon nitride film, and
   wherein the upper masking layer comprises a carbon-containing film.

4. The method of claim 3, wherein the forming of the mask pattern comprises forming the lower masking layer at a process temperature equal to or higher than room temperature and smaller than or equal to about 400° C. using an atomic layer deposition (ALD) process.

5. The method of claim 3, wherein the forming of the mask pattern comprises forming the upper masking layer using a chemical vapour deposition (CVD) process.

6. The method of claim 1, wherein the removing of the mask pattern comprises:
   a first etching operation comprising etching the upper masking layer; and
   a second etching operation comprising etching the lower masking layer.

7. The method of claim 6, wherein the first etching operation comprises dry etching the upper masking layer.

8. The method of claim 6, wherein the second etching operation comprises wet etching the lower masking layer.

9. The method of claim 1, wherein the forming of the spacers comprises forming metal oxide films.

10. The method of claim 1, wherein the forming of the spacers comprises forming the spacers at a process temperature equal to or higher than room temperature and smaller than or equal to about 400° C., by using an atomic layer deposition (ALD) process.

11. The method of claim 1,
wherein, in the preparing of the substrate, the etch target layer comprises a plurality of layers, at least one of the plurality of layers being a carbon-containing layer.

12. The method of claim 1, wherein the mask pattern further comprises a middle masking layer between the lower masking layer and the upper masking layer, the middle masking layer having a third density that is between the first density of the lower masking layer and the second density of the upper masking layer.

13. A method of forming patterns for a semiconductor device, the method comprising:
preparing a substrate comprising an etch target layer on a surface of the substrate;
forming a mask pattern comprising a plurality of layers that are sequentially formed on the etch target layer, ones of the plurality of layers comprising N masking layers stacked on each other in order of decreasing density, N being a natural number greater than or equal to 3;
forming spacers that cover sidewalls of the plurality of layers of the mask pattern;
sequentially removing the plurality of layers of the mask pattern;
anisotropically etching the etch target layer using the spacers as an etching mask; and
removing a residue of the spacers remaining after the anisotropically etching.

14. The method of claim 13, wherein the forming of the mask pattern comprises:
forming a lower first masking layer of the N masking layers, the lower first masking layer having a first density;
forming a second masking layer of the N masking layers, the second masking layer being stacked on the lower first masking layer and having a second density that is lower than the first density; and
forming a third masking layer of the N masking layers, the third masking layer being stacked on the second masking layer and having a third density that is lower than the second density,
wherein the forming the lower first masking layer comprises forming a silicon nitride film,
wherein the forming the second masking layer comprises forming a silicon oxide film, and
wherein the forming the third masking layer comprises forming a carbon-containing film.

15. A method of forming etched patterns on a surface of a substrate, comprising:
forming an etch target layer on the surface of the substrate;
forming a plurality of masking layers on the etch target layer, the plurality of masking layers comprising a first masking layer adjacent the etch target layer and comprising a first density, and a second masking layer on the first masking layer and comprising a second density that is less than the first density;
etching the plurality of masking layers to form a plurality of mask patterns;
forming spacers that cover sidewalls of the mask patterns;
removing the mask patterns;
etching the etch target layer using the spacers as an etching mask; and
removing portions of the spacers remaining after etching the etch target layer,
wherein the first masking layer comprises a thickness in a first direction that is perpendicular to the surface of the substrate that is between about ⅓ and about ½ of a total thickness of the plurality of masking layers in the first direction.

16. The method of claim 15,
wherein the thickness of the first masking layer in the first direction is about ½ of the total thickness of the plurality of masking layers in the first direction, and
wherein the second masking layer comprises a thickness in the first direction that is about ½ of the total thickness of the plurality of masking layers in the first direction.

17. The method of claim 15,
wherein the thickness of the first masking layer in the first direction is about ⅓ of the total thickness of the plurality of masking layers in the first direction, and
wherein the second masking layer comprises a thickness in the first direction that is about ⅔ of the total thickness of the plurality of masking layers in the first direction.

18. The method of claim 15,
wherein the plurality of masking layers comprises at least three masking layers sequentially stacked in order of decreasing density with the first masking layer adjacent the etch target layer comprising the highest density and an upper masking layer furthest from the etch target layer comprising the lowest density.

19. The method of claim 15,
wherein the forming the spacers comprises conformally forming a spacer layer on the mask patterns and anisotropically etching the spacer layer,
wherein the anisotropically etching the spacer layer removes at least a portion of an uppermost one of the plurality of masking layers that is furthest from the etch target layer, and
wherein the removing the mask patterns comprises sequentially removing remaining ones of the plurality of mask layers.

\* \* \* \* \*